US007459910B2

(12) United States Patent
Kawamura et al.

(10) Patent No.: US 7,459,910 B2
(45) Date of Patent: Dec. 2, 2008

(54) CONTACT WELDING DETECTING DEVICE FOR RELAY

(75) Inventors: Makoto Kawamura, Chiryu (JP); Kuniyuki Niwa, Kariya (JP); Sutemaro Kato, Kariya (JP)

(73) Assignee: Jtekt Corporation, Osaka-shi (JP)

( * ) Notice: Subject to any disclaimer, the term of this patent is extended or adjusted under 35 U.S.C. 154(b) by 77 days.

(21) Appl. No.: 11/484,653

(22) Filed: Jul. 12, 2006

(65) Prior Publication Data

US 2007/0029286 A1 Feb. 8, 2007

(51) Int. Cl.
*G01R 31/02* (2006.01)

(52) U.S. Cl. ....................... 324/418; 324/419; 324/423; 307/39; 361/179; 361/189

(58) Field of Classification Search ......... 324/418–423; 307/39

See application file for complete search history.

(56) References Cited

U.S. PATENT DOCUMENTS

| | | | | |
|---|---|---|---|---|
| 5,712,910 | A * | 1/1998 | Saito | 379/382 |
| 5,896,062 | A * | 4/1999 | Tiller et al. | 330/252 |
| 6,094,021 | A * | 7/2000 | Noro et al. | 318/400.29 |
| 6,611,416 | B1 * | 8/2003 | Cleereman et al. | 361/189 |
| 2003/0007305 | A1 * | 1/2003 | Yugou | 361/179 |

FOREIGN PATENT DOCUMENTS

| | | |
|---|---|---|
| DE | 100 11 211 A1 | 9/2001 |
| FR | 2 512 564 | 3/1983 |
| JP | 9-185932 | 7/1997 |
| JP | 11-66993 | 3/1999 |
| JP | 2005-4557 | 1/2005 |
| JP | 2005-25260 | 1/2005 |
| JP | 2005-25479 | 1/2005 |

* cited by examiner

*Primary Examiner*—Diego Gutierrez
*Assistant Examiner*—Benjamin M Baldridge
(74) *Attorney, Agent, or Firm*—Oblon, Spivak, McClelland, Maier & Neustadt, P.C.

(57) ABSTRACT

A contact welding detecting device includes: a relay including a first contact for permitting and breaking transmission of a first DC input potential to a first output and a second contact for permitting and breaking transmission of a second DC input potential; a relay open/close control unit that simultaneously controls to open and close the first and second contacts when welding of at least one of the first and second contacts is detected; a first potential difference detection unit that detects a potential difference between a first point at an input side of the first contact and a second point at an output side of the second contact; and a second potential difference detection unit that detects a potential difference between a third point at an output side of the first contact and a fourth point at an input side of the second contact.

5 Claims, 3 Drawing Sheets

CONTACT WELDING DETECTING DEVICE FOR RELAY

BACKGROUND OF THE INVENTION

The present invention relates to a contact welding detecting device for a relay, which detects welding of each contact of a relay having a first contact and a second contact, the first contact serving to permit/break the transmission of a negative DC input potential to an output side and the second contact serving to permit/break the transmission of a positive DC input potential to an output side.

In EN standard in Europe, a specific design standard that a safety relay has to satisfy is prescribed. In the case one of contacts of a relay is welded, a safety relay guarantees the other contact to be opened by a mechanical safety system. Nowadays, the safety relay is widely used as an output module that outputs electric power of a safety system constructed by, for example, using a safe PLC. Known systems constructed by using the safety relay disclosed in JP-A 2005-025479: JP-A 2005-025260; and JP-A 2005-004557.

FIG. 3 is a circuit diagram showing a related output module that outputs the electric power by using the safety relay. The safety relay sR includes contacts ‘a’ and ‘b’ and a coil. L. The contacts ‘a’ and ‘b’ are controlled to be simultaneously opened or closed by a current which flows through the coil L. However, for example, when the contact ‘a’ is welded, the contact ‘b’ is kept to be opened on the basis of a safety system ‘x’ included in the safety relay. Accordingly, even though microprocessors MPU-A and MPU-B output ON commands at the same time to make a sufficient current flow through the coil L, the current does not flow through a light-emitting diode D1 included in a photo-coupler C1. As a result, an output signal S indicating an examination result on the safety relay becomes in a High state indicative of an abnormal state.

According to the above-described related configuration, it is possible to use only one photo-coupler (photo-coupler C1 in FIG. 3) for directly detecting whether or not the relay is opened or closed and it is also possible to examine whether or not each of contacts is welded when the relay is closed (ON state) by the current flowing through the coil L.

However, since a safety relay should include a mechanical safety system as described above, it is difficult to maintain a small size and low price for the output module in the case of constructing an output module using a well-known safety relay as compared with the case of constructing the output module using a general relay.

SUMMARY OF THE INVENTION

The invention is made in consideration of the above-described problem, and it is an object of the invention to maintain a small size and low price for a power supply circuit while accurately examining the contact welding of the relay at the same level as in the related relay.

In order to solve the above-described problems, the present invention is characterized by having the following arrangement.

A contact welding detecting device comprising:

a relay including a first contact for permitting and breaking transmission of a first DC input potential to a first output and a second contact for permitting and breaking transmission of a second DC input potential higher than the first DC input potential to a second output;

a relay open/close control unit that simultaneously controls to open the first and second contacts when welding of at least one of the first and second contacts is detected;

a first potential difference detection unit that detects a potential difference between a first point at an input side of the first contact and a second point at an output side of the second contact; and a second potential difference detection unit that detects a potential difference between a third point at an output side of the first contact and a fourth point at an input side of the second contact.

(2) The contact welding detecting device according to (1), wherein the first and second potential difference detection units are driven by a common feeder circuit, and an output terminal of the first potential difference detection unit and an output terminal of the second potential difference detection unit are connected in parallel with respect to the common feeder circuit to output a detection signal indicative of a welding state in which at least one of the first and second contacts is welded.

(3) The contact welding detecting device according to (1), wherein the first potential difference detection unit includes a first resistor and a first photo-coupler, the first resistor and a light emitting diode included in the first photo-coupler being connected in series to each other between the first point and the second point; and the second potential difference detection unit includes a second resistor and a second photo-coupler, the second resistor and a light emitting diode included in the second photo-coupler being connected in series to each other between the third point and the fourth point.

(4) The contact welded detecting device according to (3), wherein the first and second potential difference detection units include a third common resistor, and collector terminals of optical transistors included in the first and second photo-couplers are connected to each other and connected to a feeder circuit through the third common resistor, and a point between the collector terminals and the third resistor outputs a detection signal indicative of a welding state in which at least one of the first and second contacts is welded.

(5) The contact welded detecting device according to (3), wherein the first potential difference detection unit includes a third resistor connecting a collector terminal of an optical transistor included in the first photo-coupler to a feeder circuit, and a point between the collector terminal and the third resistor outputs a detection signal indicative of a welding state in which the second contact is welded, and the second potential difference detection unit includes a fourth resistor connecting a collector terminal of an optical transistor included in the second photo-coupler to a feeder circuit, and a point between the collector terminal and the fourth resistor outputs a detection signal indicative of a welding state in which the first contact is welded.

According to the above invention, it is not necessary to use a safety relay as the above-mentioned relay. Operation and effects of the invention which will be described below can be obtained when using a general relay, of which price is low and which is smaller than the safety relay.

According to the invention, when the contacts are simultaneously controlled to be opened by using the relay open/close control unit, a process of detecting the welding state of each contact is performed. At this time, when the first potential difference detection unit detects potential difference higher than a predetermined threshold, it is determined that the second contact is welded. In addition, when the second potential difference detection unit detects potential difference higher than a predetermined threshold, it is determined that the first contact is welded.

Therefore, according to the first aspect of the invention, even though a general relay, or which price is low and is smaller than the safety relay having a mechanical safety system, is used, it is possible to check stability (an abnormal state of the contacts of the relay) (welding examination) at the same level as in the related art. Therefore, according to the invention, a small output module with a low price and small size can be effectively accomplished.

Further, according to the invention, since the detection signal indicative of the welding state in which any one of the first contact and the second contact is welded can be generated, only one MPU (microprocessor) and one interface may be necessary so as to input/output the detection signal. In addition, the abnormal state such as emergency shutdown of a system can be processed on the basis of only the detection signal.

Therefore, it is possible to constitute a contact welding detection circuit, the MPU, and the input/output interface in the simple structure and it is easy to integrally and rapidly process the abnormal state such as the emergency shutdown of the system.

Further, according to the invention, since the potential difference detection unit includes the photo-coupler, even when DC currents are different between a measured side in which potential difference should be measured and a measuring side which measures the potential difference, it is easy to design the potential difference detection unit and it is possible to construct a small and simple potential difference detection unit.

DETAILED DESCRIPTION OF PREFERRED EMBODIMENTS

Hereinafter, embodiments according to the invention will be described in detail.

However, the embodiments according to the invention are not limited to those described below.

First Embodiment

Figure 1:
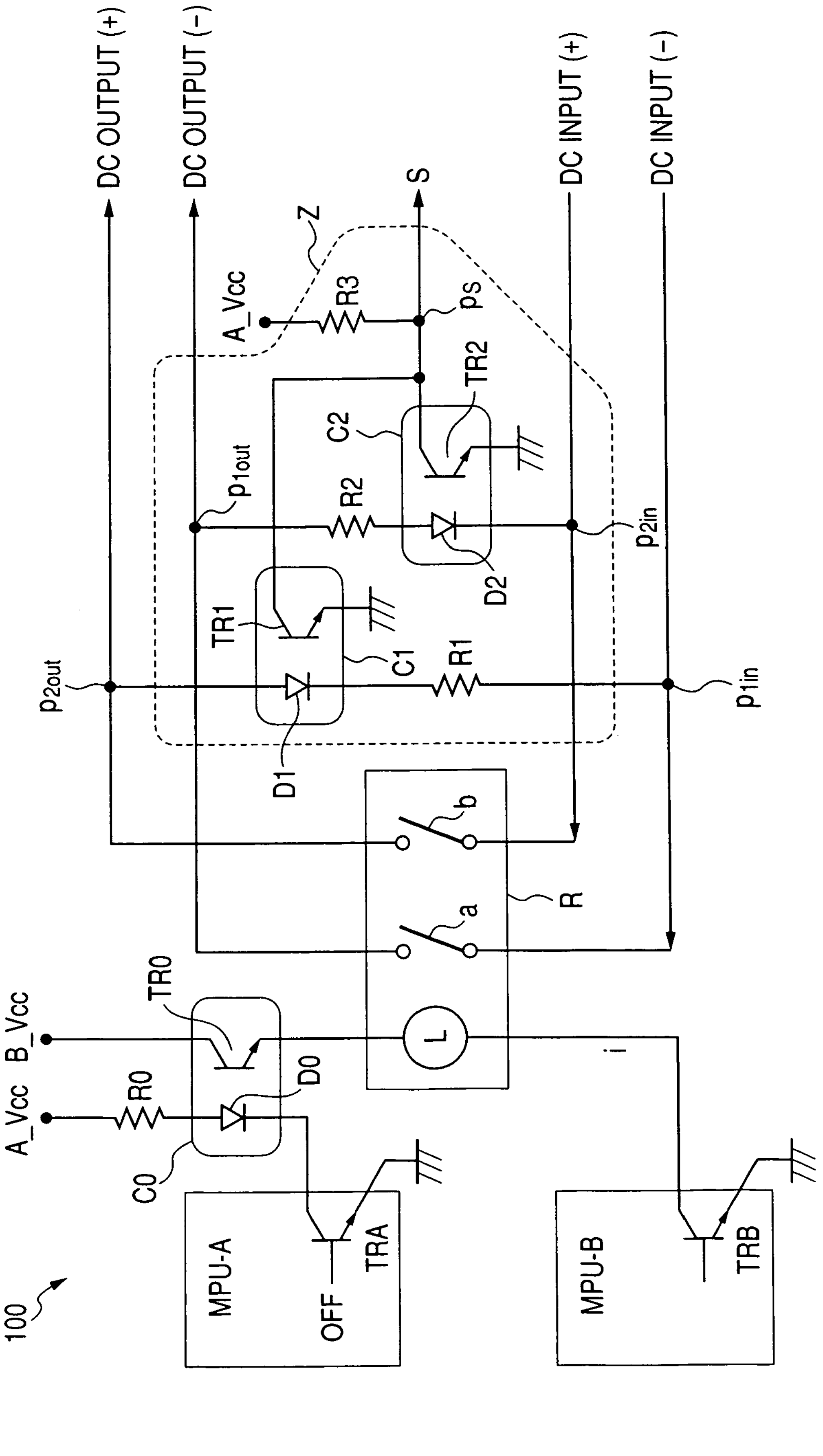
FIG. 1 is a circuit diagram showing an output module 100 in which a general relay is used according to a first embodiment of the invention.

FIG. 1 is a circuit diagram showing an output module 100 using a general relay according to the first embodiment. The output module 100 includes a contact welding detection device according to the invention. The contact welding detection device according to the first embodiment includes transistors TRA and TRB that are respectively provided in microprocessors MPU-A and MPU-B so as to realize a relay open/close control unit according to the invention, and a contact welding detection circuit Z. The contact welding detection circuit Z includes a first potential difference detection unit and a second potential difference detection unit.

The first potential difference detection unit detects a potential difference between an input point $\mathbf{P1}_{in}$ of a first contact 'a' and an output point $\mathbf{P2}_{out}$ of a second contact 'b' when executing a detection process of detecting whether or not the first contact 'a' or the second contact 'b' of the relay R is welded. The second potential difference detection unit detects a potential difference between an output point $\mathbf{P1}_{out}$ of the first contact 'a' and an input point $\mathbf{P2}_{in}$ of the second contact 'b' when executing the same detection process.

The first potential difference detection unit includes a photo-coupler C1, a resistor R1 and a resistor R3. An anode terminal of a light emitting diode D1 included in a primary-side element of the photo-coupler C1 is-connected to the output point $\mathbf{P2}_{out}$ of the second contact 'b', while a cathode terminal of the light emitting diode D1 is connected to the input point $\mathbf{P1}_{in}$ of the first contact 'a' through the resistor R1. That is, the light emitting diode D1 is connected in series with the resistor R1 between the input point $\mathbf{P1}_{in}$ of the first contact 'a' and the output point $\mathbf{P2}_{out}$ of the second contact 'b'.

An optical transistor TR1 included in a secondary-side element of the photo-coupler C1 receives light emitted from the light emitting diode D1 so as to be an ON state. An emitter terminal of the optical transistor TR1 is connected to a ground and a collector terminal thereof is connected to one end of the resistor R3 at a contact $P_s$. The other end of the resistor R3 is hold at a DC potential $A\_V_{cc}$. The DC potential $A\_V_{cc}$ is supplied from a feeder circuit that feeds a voltage to the microprocessor MPU-A in parallel thereto.

On the other hand, the second potential difference detection unit has the same configuration as the first potential difference detection unit. That is, the second potential difference detection unit includes a photo-coupler C2, a resistor R2. and the resistor R3. An anode terminal of a light emitting diode D2 included in a primary-side element of the photo-coupler C2 is connected to the input point $\mathbf{P2}_{in}$ of the second contact 'b' while a cathode terminal of the light emitting diode D2 is connected to the output point $\mathbf{P1}_{out}$ of the first contact 'a' through the resistor R2. That is, the light emitting diode D2 is connected in series with the resistor R2 between the output point $\mathbf{P1}_{out}$ of the first contact 'a' and the input point $\mathbf{P2}_{in}$ of the second contact 'b'.

An optical transistor TR2 included in a secondary-side element of the photo-coupler C2 receives light emitted from the light emitting diode D2 so as to be an ON state. An emitter terminal of the optical transistor TR2 is connected to a ground and a collector terminal thereof is connected to one end of the resistor R3 at the contact $P_s$. In other words, the resistor R3 is shared by the first potential difference detection unit and the second potential difference detection unit. Therefore, the first potential difference detection unit and the second potential difference detection unit according to the first embodiment are connected in parallel with respect to the feeder circuit which feeds the DC potential $A_{13}\ V_{cc}$.

The transistors TRA and TRB, which constitute the relay open/close control unit according to the invention, control the current which flows through a coil L of the relay R having the general configuration. When a sufficiently large current flows through the coil L, both the first contact 'a' and the second contact 'b' are controlled to be closed (ON state).

For example, since a current 'i' flowing through the coil L is a collector current flowing through the transistor TRB, when the emitter current is provided from an optical transistor TR0, it is possible to simultaneously control the ON/OFF state of each contact in the same direction according to a level (ON/OFF state) of a base voltage of the transistor TRB.

A secondary-side element of a photo-coupler C0 includes an optical transistor TR0 and a primary-side element of the photo-coupler C0 includes a light emitting diode D0. Thus, it is possible to simultaneously control the contacts 'a' and 'b' to be the same state (ON/OFF State) by controlling a level of a base voltage (ON/OFF control) of the transistor TRA whose collector terminal is connected to a cathode terminal of the light emitting diode D0.

That is, it is possible to simultaneously make both of the contacts ‘a’ and ‘b’ to be the OFF state (open state) by lowering the base voltage of the transistor TRA or the base voltage of the transistor TRB (to be OFF state).

Hereinbefore, the configuration and operation of the relay open/close control unit according to the invention have been described.

The contact welding detection circuit Z according to the first embodiment is activated when the both contacts ‘a’ and ‘b’ are controlled to be the OFF state (open state) by using the relay open/close control unit (transistor TRA and transistor TRB).

At that time, for example, if the first contact ‘a’ is welded, a negative DC potential is applied to the output point $P\mathbf{1}_{out}$ by electrically connecting the contact ‘a’, and thus a large electrical potential difference is generated between the input point $P\mathbf{2}_{in}$ having a positive DC potential and the output point $P\mathbf{1}_{out}$. Therefore, light is emitted from the light emitting diode D2 and the collector current of the optical transistor TR2 flows through the resistor R3, so that a detection signal S (that is, DC potential at the point $P_s$), which is output from the contact $P_s$ and is then input to an input port of the microprocessor MPU-A, becomes low at this time (becomes a Low state).

In the case that the state of both contacts ‘a’ and ‘b’ are controlled to be the OFF state (opened state) by the relay open/close control unit (the transistor TRA and the transistor TRB), if, for example, the second contact ‘b’ is welded, positive DC potential is applied to the output point $P\mathbf{2}_{out}$ by electrically connecting the second contact ‘b’, and thus a large electrical potential difference is generated between the input point $P\mathbf{1}_{in}$ having a negative DC potential and the output point $P\mathbf{2}_{out}$. Therefore, the light emitting diode D1 emits light and the collector current of the optical transistor TR1 flows through the resistor R3, so that the detection signal S output from the point $P_N$ becomes a Low state at this time.

That is, by employing the contact welding detection circuit Z (first and second potential difference detection unit according to the first embodiment) according to the first embodiment of the invention is used, the detection signal S indicates the High state owing to the operations of the contact welding detection circuit Z only in the case both contacts ‘a’ and ‘b’ do not weld, whereas in the case other than the above case, that is, the case an abnormal state with respect to the relay contact welding is detected, the detection signal S indicates the Low state. Accordingly, it is possible to detect the contact welding of the relay by determining a value of the detection signal S.

By using the above-described controlling method, it is possible to maintain a small size and low price for the output module 100 while accurately examining the contact welding of the relay at the same level as in the relate relay without using a large and expensive safety relay.

Modifications

It is to be understood that the technical scope of the invention is not limited to the above-described embodiments, and various modifications as shown below can be made to the respective embodiments without departing from the scope and spirit of the invention. That is, the same effect can-be obtained on the basis of an operation of the invention by using the modification or application.

First Modification

Figure 2:
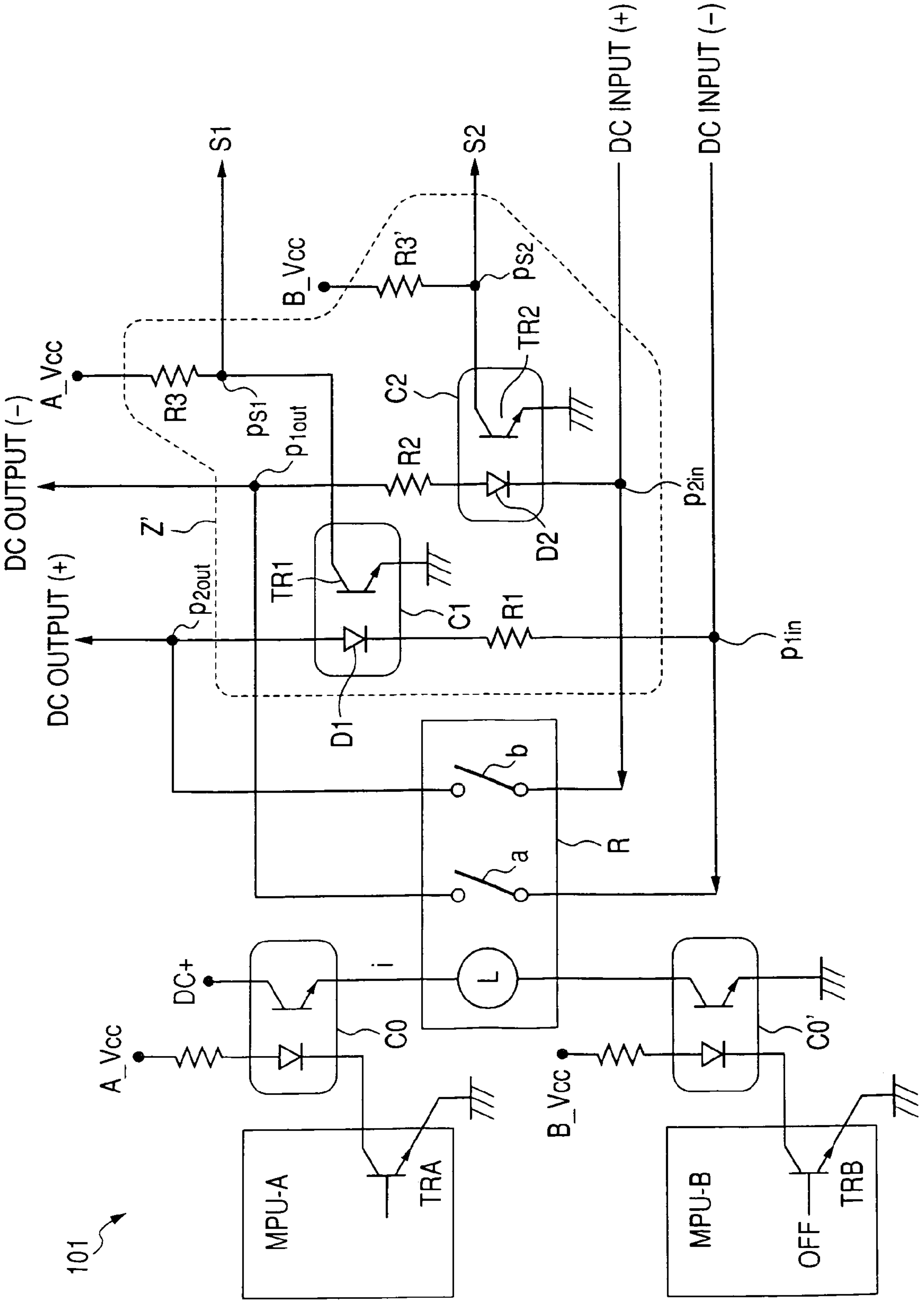
FIG. 2 is a circuit diagram showing an output module 101 in which a general relay is used according to a first modification of the invention.
Figure 3:
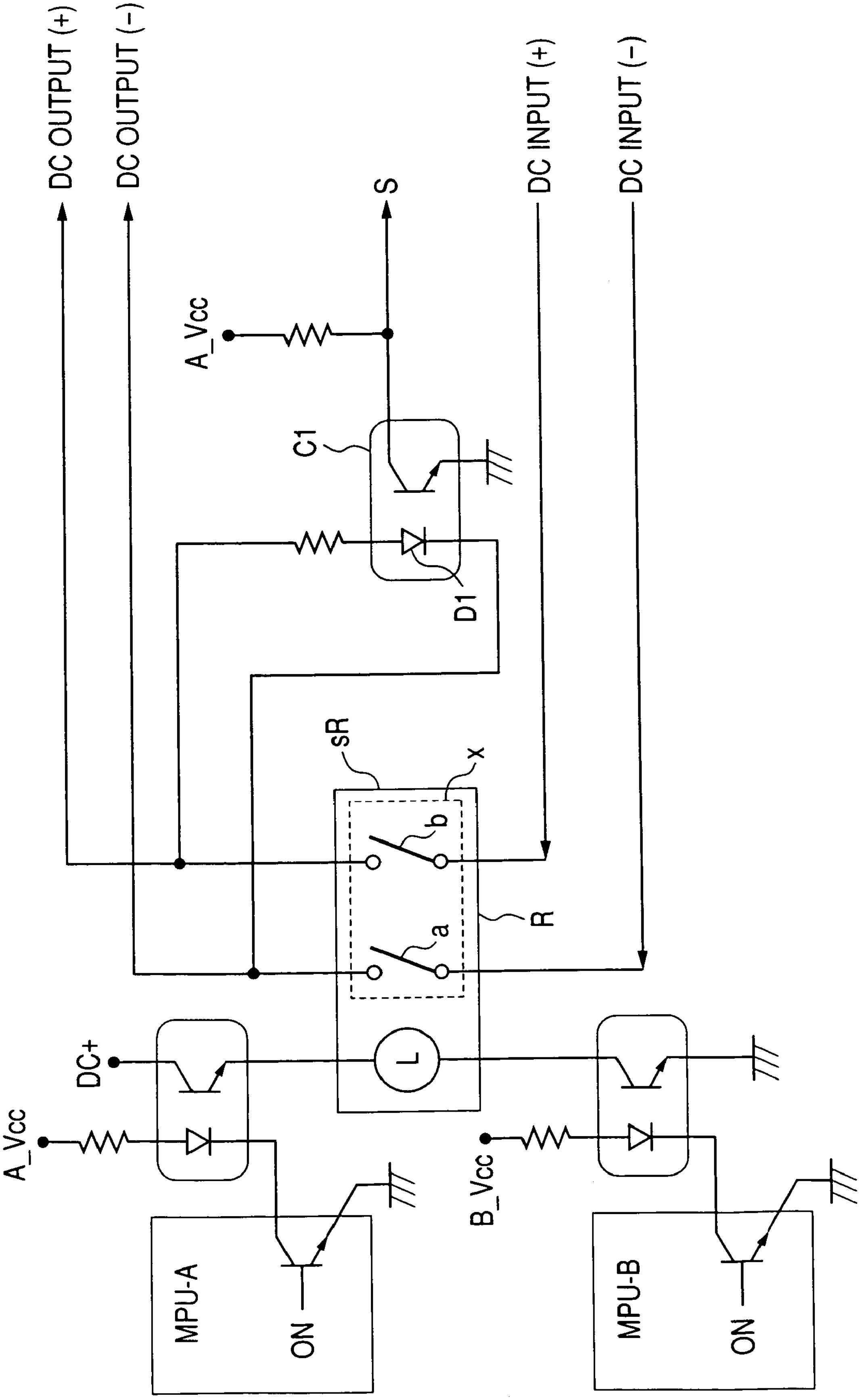
FIG. 3 is a circuit diagram showing a related output module which in which a safety relay is used.

FIG. 2 is a circuit diagram showing an output module 101 using a general relay according to a first modification of the invention. The output module 101 is obtained by modifying the output module 100 according to the first embodiment. A relay open/close control unit according to the first modification, which is used in the output module 101, includes transistors TRA and TRB. The relay open/close control unit controls the contacts ‘a’ and ‘b’ of the relay R in such a manner that both contact ‘a’ and ‘b’ of the relay R become an OFF state (open state) at the same time by making at least one of the transistors TRA and TRB an OFF state. This control and using a predetermined contact welding detection circuit are as the same with the first embodiment. Therefore, the operation becomes completely different from the related output module shown in FIG. 3.

The most significant characteristic of the output module 101 is the configuration of the contact welding detection circuit Z'. In the configuration of the contact welding detection circuit Z' according to the first modification, two circuits that are connected to collector terminals of the optical-transistors TR1 and TR2 of the photo-couplers C1 and C2 included in the first and second potential difference detection units, respectively, are symmetrically separated.

The collector terminal of the optical-transistor TR1 included in a part of the first potential difference detection unit is connected to a resistor R3 at a point $P_{s1}$. The current is supplied from a feeder circuit which feeds the current to a microprocessor MPU-A through the resistor R3. Therefore, one end of the resistor R3 is held at a DC potential $A\_V_{cc}$ and the collector potential (that is, detection signal S1) of the optical-transistor TR1 is output from the point $P_{s1}$ and input to an input port of the microprocessor MPU-A.

Further, in the same manner, the collector terminal of the optical-transistor TR2 included in a part of the second potential difference detection unit is connected to a resistor R3' at a point $P_{s2}$. The current is supplied from a feeder circuit which feeds the current to the microprocessor MPU-B through the resistor R3'. Therefore, one end of the resistor R3' is held at a DC potential $B\_V_{cc}$ and the collector potential (that is, detection signal S2) of the optical-transistor TR2 is output from the point $P_{s2}$ and input to an input port of the microprocessor MPU-B.

According to the above-described configuration, it is possible to individually examine the welding of the first and second relay contacts ‘a’ and ‘b’. At the same time, it is also possible to obtain approximately the same operation and effect as in the first embodiment.

Second Modification

Since the examination according to the first embodiment and first modification are for detecting the contact welding of the relay, it is preferable to execute the examination once or a predetermined number of examinations when starting a system which performs an initialization process of the control program at the system.

Further, the examination for detecting the relay contact welding may be periodically performed when a temporary blackout of the power supply is permitted.

Further, the instantaneous interruption of the power supply may be prevented or relieved by providing a low pass filter at a point where the DC is output from the output module. If the low pass filter is provided at an output unit of the power supply circuit, a process of responding to emergency shutdown of the system may be deteriorated. However, in a timing which allows to provide the low pass filter at the DC output (power supply is supplied through the low pass filter), that is, by periodically providing a limited period of time in which the deterioration of the process of responding to the emergency shutdown is temporally permitted, the examination of detecting the relay contact welding as described above may be periodically performed while supplying the power supply through the low pass filter at the limited period of time.

What is claimed is:

1. A contact-welding detecting device comprising:

a relay including a first contact for permitting and breaking transmission of a first DC input potential to a first output and a second contact for permitting and breaking transmission of a second DC input potential higher than the first DC input potential to a second output;

a relay open/close control unit that simultaneously controls to open the first and second contacts when welding of at least one of the first and second contacts is detected;

a first potential difference detection unit that detects a potential difference between a first point at an input side of the first contact and a second point at an output side of the second contact; and a second potential difference detection unit that detects a potential difference between a third point at an output side of the first contact and a fourth point at an input side of the second contact.

2. The contact welding detecting device according to claim 1, wherein the first and second potential difference detection units are driven by a common feeder circuit, and an output terminal of the first potential difference detection unit and an output terminal of the second potential difference detection unit are connected in parallel with respect to the common feeder circuit to output a detection signal indicative of a welding state in which at least one of the first and second contacts is welded.

3. The contact welding detecting device according to claim 1, wherein the first potential difference detection unit includes a first resistor and a first photo-coupler, the first resistor and a light emitting diode included in the first photo-coupler being connected in series to each other between the first point and the second point; and the second potential difference detection unit includes a second resistor and a second photo-coupler, the second resistor and a light emitting diode included in the second photo-coupler being connected in series to each other between the third point and the fourth point.

4. The contact welding detecting device according to claim 3, wherein the first and second potential difference detection units include a third common resistor, and collector terminals of optical transistors included in the first and second photo-couplers are connected to each other and connected to a feeder circuit through the third common resistor, and a point between the collector terminals and the third resistor outputs a detection signal indicative of a welding state in which at least one of the first and second contacts is welded.

5. The contact welding detecting device according to claim 3, wherein the first potential difference detection unit includes a third resistor connecting a collector terminal of an optical transistor included in the first photo-coupler to a feeder circuit, and a point between the collector terminal and the third resistor outputs a detection signal indicative of a welding state in which the second contact is welded, and the second potential difference detection unit includes a fourth resistor connecting a collector terminal of an optical transistor included in the second photo-coupler to a feeder circuit, and a point between the collector terminal and the fourth resistor outputs a detection signal indicative of a welding state in which the first contact is welded.

* * * * *

UNITED STATES PATENT AND TRADEMARK OFFICE

CERTIFICATE OF CORRECTION

PATENT NO. : 7,459,910 B2
APPLICATION NO. : 11/484653
DATED : December 2, 2008
INVENTOR(S) : Kawamura et al.

It is certified that error appears in the above-identified patent and that said Letters Patent is hereby corrected as shown below:

On the title page, Item (30), The Foreign Application Priority Data has been omitted. Item (30) should read:

Item --(30) Foreign Application Priority Data

July 13, 2005 (JP) ..............................................2005-203877--

Signed and Sealed this

Seventeenth Day of February, 2009

JOHN DOLL

*Acting Director of the United States Patent and Trademark Office*